US008589834B2

(12) United States Patent
Needham et al.

(10) Patent No.: US 8,589,834 B2
(45) Date of Patent: Nov. 19, 2013

(54) USING DIRECT MEMORY ACCESS TO INITIALIZE A PROGRAMMABLE LOGIC DEVICE

(75) Inventors: Thomas D. Needham, Poughkeepsie, NY (US); Andrew R. Ranck, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/547,490

(22) Filed: Jul. 12, 2012

(65) Prior Publication Data

US 2012/0278510 A1 Nov. 1, 2012

Related U.S. Application Data

(62) Division of application No. 11/670,017, filed on Feb. 1, 2007, now Pat. No. 8,407,658.

(51) Int. Cl.
*G06F 17/50* (2006.01)

(52) U.S. Cl.
USPC .......................................... 716/101; 716/117

(58) Field of Classification Search
USPC ................................................ 716/100–106
See application file for complete search history.

(56) References Cited

U.S. PATENT DOCUMENTS

| 5,752,035 | A | 5/1998 | Trimberger |
| 6,204,687 | B1 | 3/2001 | Schultz et al. |
| 6,496,971 | B1 | 12/2002 | Lesea et al. |
| 6,560,665 | B1 | 5/2003 | Resler et al. |
| 6,738,962 | B1 | 5/2004 | Flaherty et al. |
| 6,810,514 | B1 | 10/2004 | Alfke et al. |
| 6,907,595 | B2 | 6/2005 | Curd et al. |
| 7,370,310 | B1 * | 5/2008 | Saini et al. ..................... 716/128 |
| 2001/0033580 | A1 * | 10/2001 | Dorsey et al. ................. 370/466 |
| 2002/0100029 | A1 | 7/2002 | Bowen |
| 2003/0041129 | A1 | 2/2003 | Appleby-Allis |
| 2004/0233994 | A1 | 11/2004 | Pearson |
| 2006/0236018 | A1 * | 10/2006 | Dao et al. ...................... 710/317 |

FOREIGN PATENT DOCUMENTS

| JP | 04199228 A | 7/1992 |
| JP | 06068320 A | 3/1994 |
| JP | 2000322375 A | 11/2000 |
| JP | 92003229760 A | 8/2003 |

(Continued)

OTHER PUBLICATIONS

English Abstract for JP04199228A; Published Jul. 1, 1992; Fujita KK.

(Continued)

*Primary Examiner* — Binh Tat
(74) *Attorney, Agent, or Firm* — Cantor Colburn LLP; William A. Kinnaman, Jr.

(57) ABSTRACT

An embodiment includes an integrated circuit (IC) for using direct memory access (DMA) to initialize a programmable logic device (PLD), the IC operably coupled to the PLD. The IC includes an input/output (I/O) interface and a PLD interface. The I/O interface converts a signal format between the IC and the PLD. The PLD interface includes a configuration and status register, a data buffer, and pacing logic. The configuration and status register is adapted to manipulate a control line of the PLD to configure the PLD in a programming mode via the I/O interface. The data buffer temporarily holds PLD programming data received from a DMA control at a DMA speed. The pacing logic controls the speed of transmitting the PLD programming data to a programming port on the PLD via the I/O interface at a PLD programming speed.

14 Claims, 7 Drawing Sheets

(56) References Cited

FOREIGN PATENT DOCUMENTS

| JP | 2003281077 A | 10/2003 |
|---|---|---|
| JP | 200544247 A | 9/2005 |
| JP | 2005258996 A | 9/2005 |

OTHER PUBLICATIONS

English Abstract for JP06068320A; Published Mar. 11, 1994; Ricoh Co. Ltd.

English Abstract for JP92000322375; Published Nov. 24, 2000; Sharp KK.

English Abstract for JP92003229760; Published Aug. 15, 2003; Hitachi High Tech Corp.

English Abstract for JP92003281077; Published Oct. 3, 2003; Hitachi Ltd & Hitachi ULSI Sys Co Ltd.

English Abstract for JP9200524427 Published Sep. 8, 2005; Renesas Tech Corp.

English Abstract for JP92005258996; Published Sep. 22, 2005; Meidensha Electirc MFG Co Ltd.

GT Davis, "Microprocessor Based Programming Panel for Field Programmable Logic Array," TDB; pp. 5099-5100; May 1978.

\* cited by examiner

USING DIRECT MEMORY ACCESS TO INITIALIZE A PROGRAMMABLE LOGIC DEVICE

CROSS-REFERENCE TO RELATED APPLICATION

This application is a divisional of U.S. patent application Ser. No. 11/670,017, filed Feb. 1, 2007, the disclosure of which is incorporated by reference herein in its entirety.

BACKGROUND

This invention relates generally to initializing a programmable logic device, and more particularly to methods, systems, and computer program products for using direct memory access to initialize a programmable logic device.

Many computer/electronic systems use programmable logic devices (PLDs) configured to perform application specific functions. PLDs may include a wide range of programmable logic devices such as programmable logic arrays (PLAs), programmable array logic (PAL), generic logic arrays (GALs), complex programmable logic devices (CPLDs), field programmable gate arrays (FPGAs), and other technologies known in the art. A number of PLD technologies are field programmable, such as FPGAs, and such devices may require programming each time they are powered on. PLDs that require reprogramming on each depower/power cycle are typically referred to as "volatile" PLDs, and may rely upon static random access memory (SRAM) for a programmed device configuration while powered. Volatile PLDs may also need periodic refreshing or may require reprogramming if a transient or "soft" (recoverable) error occurs. Soft errors may result from environmental effects such as electromagnetic interference (EMI), cosmic rays, alpha particles, thermal neutrons, noise, and other similar sources.

Systems that include volatile PLDs are often designed to support frequent reprogramming, a technique referred to as "reconfigurable computing". In a system employing reconfigurable computing, the time required to program a PLD can be a critical factor in system performance and overall responsiveness. In such a system, there may be multiple PLD programs that must be loaded as part of system initialization, resulting in a long system initialization time.

A PLD may be programmed in the field without the use of special test equipment interfaces, such as board-level or component-level loaders with joint test action group (JTAG) compliant interfaces. Access to a JTAG port on a PLD is usually limited to a manufacturing or test facility. "Field programming" may include programming in a closed system at customer facility or at a location external to a manufacturer, where access to special test equipment is limited or infeasible. Programming techniques available without special test equipment may also be performed at a manufacturing or test facility.

In one method of programming a PLD in the field, the PLD automatically loads its configuration from a serial electronically erasable programmable read-only memory (EEPROM) or flash memory device. Each PLD may have a dedicated serial EEPROM directly coupled to the PLD as a discrete component on the same system board. This method of programming has been referred to as "active serial" programming or loading. Active serial programming may provide benefits in that the specific program for each PLD can be isolated to minimize the risk of mismatching a PLD program with a targeted PLD. However, active serial programming can be slow if the serial programming speed is slow, particularly when the bit rate is low relative to the associated programming clock speed (e.g., one bit per clock cycle). A PLD utilizing active serial programming may start to load its PLD program whenever the PLD is released from reset, which can complicate the reset design of the system. Complications can arise if other system components are not intended to be reset whenever the PLD program is loaded. Active serial programming can present a number of other issues, such as version control management of the PLD program in the serial EEPROM, particularly in updating and verifying the correct/latest version of the PLD program. Serial EEPROMs may not support field reprogramming, requiring board rework or physical part replacement for a socketed serial EEPROM component. Errors or failures in serial EEPROMs may also be difficult to detect and isolate, resulting in an increased number of system failure modes. The use of serial EEPROMs may have additional penalties in cost, board area, power consumption, heat, weight, and obsolescence issues in the manufacturing process.

Another method of programming a PLD in the field is through external programming actively controlled by a processor. PLD programming may be carried out by a general-purpose processor through data bus writes, and PLD control signals may be manipulated via a software program executing upon the processor. The processor typically reads the PLD programming data, writes the data directly on a data bus to the PLD one byte at a time, and manipulates the appropriate control signals such that the PLD accepts the data as programming information. Although actively controlling the PLD programming process through the processor may provide flexibility, PLD programming may consume the processor's bandwidth for a significant duration, particularly if the PLD programming file is large. While the processor is busy actively programming the PLD, the processor must wait to perform other system initialization tasks, causing an extended time delay to initialize an entire system. If there are multiple PLDs in the system with different PLD programs, the problem is further compounded, as the processor may not perform other tasks while its resources are dedicated to programming the PLDs.

As the size of PLD programming files continues to grow with the development of more advanced technologies, the demand on a processor performing active PLD programming will continue to increase, resulting in a longer system initialization time. Furthermore, larger PLD programming files will impact the required storage capacity of serial EEPROMs, potentially resulting in larger components, longer programming time, and a higher system cost. Accordingly, there is a need in the art for a method of programming of a PLD without relying upon direct active control by a processor or active serial programming.

SUMMARY

Embodiments include an integrated circuit (IC) for using direct memory access (DMA) to initialize a programmable logic device (PLD), the IC operably coupled to the PLD. The IC includes an input/output (I/O) interface and a PLD interface. The I/O interface converts a signal format between the IC and the PLD. The PLD interface includes a configuration and status register, a data buffer, and pacing logic. The configuration and status register is adapted to manipulate a control line of the PLD to configure the PLD in a programming mode via the I/O interface. The data buffer temporarily holds PLD programming data received from a DMA control at a DMA speed. The pacing logic controls the speed of transmitting the PLD programming data to a programming port on the PLD via the I/O interface at a PLD programming speed.

Further embodiments include a system for using DMA to initialize a PLD. The system includes the PLD and an IC. The PLD includes a programming port with a control line, the PLD on an assembly. The IC is operably coupled to the programming port of the PLD, the IC on the assembly. The IC includes an I/O interface for converting a signal format between the IC and the PLD, and a PLD interface. The PLD interface includes a configuration and status register, a data buffer, and pacing logic. The configuration and status register is adapted to manipulate the control line of the programming port of the PLD via the I/O interface. The data buffer temporarily holds PLD programming data received from a DMA control at a DMA speed. The pacing logic controls the speed of transmitting the PLD programming data to the programming port on the PLD via the I/O interface at a PLD programming speed.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF SEVERAL VIEWS OF THE DRAWINGS

Referring now to the drawings wherein like elements are numbered alike in the several FIGURES.

DETAILED DESCRIPTION

An exemplary embodiment utilizes direct memory access (DMA) to initialize a programmable logic device (PLD). A DMA control within a system is used in conjunction with a small amount of additional logic to program (initialize/load) a field programmable PLD. Software executing upon a processor may initiate the PLD programming sequence through the DMA control and associated logic. The use of the DMA control and associated logic ensures that the processor is not tied up in providing active control during the PLD programming process. As a result, the processor can perform other system initialization operations in parallel (e.g., built-in tests, initialization of memory to a known state, etc.) while the PLD is programmed rather than executing initialization tasks sequentially. Parallel execution of system initialization may decrease system initialization time and increase responsiveness. Software executing upon the processor can control when the PLD programming process initiates, as well as determine the source of the PLD programming data, providing greater flexibility than can be achieved using a static programming/loader approach, e.g. direct serial EEPROM programming.

Figure 1:
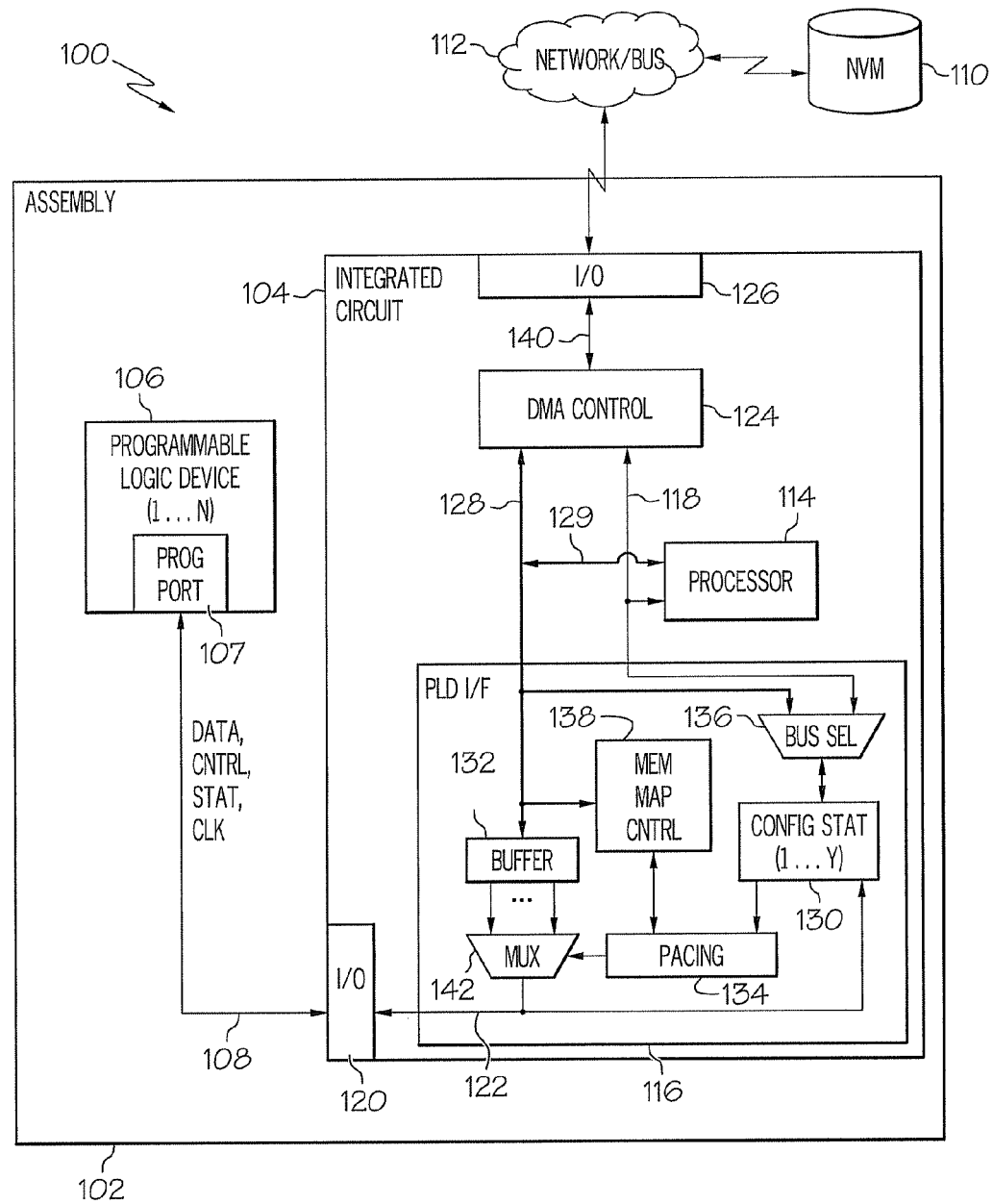
FIG. 1 is a block diagram of a system using direct memory access (DMA) to initialize a programmable logic device (PLD) that may be implemented by an exemplary embodiment.

Turning now to the drawings in greater detail, it will be seen that in FIG. 1 there is a block diagram of a system 100 upon which using DMA to initialize a PLD can be implemented in accordance with exemplary embodiments. The system 100 of FIG. 1 includes an assembly 102. The assembly 102 may be a card, a board, a module, or a subsystem within a larger system. In an exemplary embodiment, the assembly 102 includes an integrated circuit (IC) 104 operably coupled to a PLD 106 through a bus 108, enabling the IC 104 perform such operations as configuring the PLD 106 in a programming mode, programming the PLD 106, and monitoring the status of the PLD 106. While only one PLD 106 is depicted, it will be understood that multiple PLDs (between 1 and N) may be coupled to the IC 104. The PLD 106 may be any type of programmable logic device known in the art, such as a programmable logic array (PLA), programmable array logic (PAL), a generic logic array (GAL), a complex programmable logic devices (CPLD), or a field programmable gate array (FPGA). In an exemplary embodiment, the PLD 106 is a volatile PLD that is initialized with PLD program configuration code (PLD programming data) upon each power-on cycle of the PLD 106. The PLD 106 may also be reprogrammed at other times, such as a reset or when updated PLD programming data is available. In an exemplary embodiment, the PLD 106 is programmed through a programming port 107. The programming port 107 may also include control, status, and clock signal connections. The bus 108 may be a parallel bus adapted to support communication between the IC 104 and the PLD 106. The bus 108 may include various hardware elements known in the art, such as buffers, pull-up or pull-down resistors, and one or more multiplexers to support various bus formats and multiple PLDs (1 . . . N) 106. The bus 108 may be organized as address, data, control, status, interrupt, and clock lines. In an alternate exemplary embodiment, multiple busses 108 exist in parallel between the IC 104 and the multiple PLDs 106 to support parallel PLD programming and provide increased isolation in case of a failure.

In an exemplary embodiment, the IC 104 interfaces with non-volatile memory (NVM) 110 through a network/bus 112. The NVM 110 stores programming and configuration data for the PLD 106. The NVM 110 may be any type of non-volatile memory known in the art capable of retaining data through an on/off power cycle, such as EEPROM, flash memory, a hard disk drive, or non-volatile random access memory (NVRAM). In an exemplary embodiment, the NVM 110 is located remotely from the assembly 102. By locating the NVM 110 external to the assembly 102, the total cost, size, power consumption, and weight of the assembly 102 may be reduced as compared to systems that include serial EEPROM local to a PLD as an additional component on the assembly. Furthermore, the NVM 110 may be a shared resource for multiple assemblies 102, providing a common resource to update rather than requiring individual updates to each assembly 102 in the system 100. Locating the NVM 110 external to the assembly 102 also reduces the risk of part obsolescence for the assembly 102 (i.e., manufacturing/purchasing issues arising from a reduced availability or nonavailability of a component, such as a serial EEPROM). Board rework and scrap may also be reduced as a result of locating the NVM 110 external to the assembly 102. The network/bus 112 may be any network or bus architecture known in the art. For example, the network/bus 112 may be a peripheral component interconnect (PCI) bus, a PCI express bus, a high-speed serial bus, or a proprietary bus format. In an alternate exemplary embodiment, the network/bus 112 is an intranet, extranet, or internetwork, such as the Internet, or a combination thereof, and implemented as a wireless or wireline network.

In an exemplary embodiment, the IC 104 is a system-on-a-chip (SOC), including a processor 114, PLD interface (I/F) logic 116, an input/output (I/O) interface 120, a DMA control 124, and an I/O interface 126. The IC 104 may be any integrated circuit technology known in the art, such as an application specific integrated circuit (ASIC) or a PLD. The processor 114 may be any processing circuit capable of executing instructions known in the art, such as an embedded microprocessor, a microcontroller, a state-machine, a digital signal processor (DSP), or a logic device. Furthermore, the processor 114 may be distributed or partitioned into multiple processing elements within the IC 104 (e.g., multi-core processing). The processor 114 may include a readable storage medium for storing executable instructions. In an exemplary embodiment, the processor 114 is operably coupled to the DMA control 124 and the PLD I/F 116 through a bus 118. The bus 118 provides a path for non-DMA data such as register access, enabling the DMA control 124 and the PLD I/F 116 to appear within the register map of the processor 114 without impeding DMA transfers. The bus 118 may include address, data, control, status, interrupt, and clock lines. In an alternate exemplary embodiment, the bus 118 is a serial bus. Other logic or memory (not depicted) within the IC 104 may also be coupled to the bus 118.

The PLD I/F 116 is operably coupled to the I/O interface 120 through a bus 122. The bus 122 may include address, data, control, status, interrupt, and clock lines in a parallel or serial configuration. The I/O interface 120 provides signal conditioning and electrical buffering between the bus 122 and the bus 108. For example, the bus 122 and the bus 108 may operate at different voltage levels (e.g., 1.5 volts, 1.8 volts, 2.5 volts, 3.3 volts, etc.), with the I/O interface 120 converting the signal format (e.g., single-ended, differential, voltage-referenced) and voltage level between the IC 104 and the PLD 106.

The DMA control 124 is operably coupled to the PLD I/F 116 through a bus 128. The bus 128 provides an independent path for passing data between the DMA control 124 and the PLD I/F 116. In an exemplary embodiment, the bus 128 provides access to memory-mapped elements of the IC 104, supporting addressable bus access by elements capable of controlling (mastering) the bus 128. In an exemplary embodiment, the bus 128 is primarily used for passing data, while the bus 118 is primarily used for configuration and status. The separation of busses 128 and 118 enables the DMA control 124 to pass data to the PLD I/F 116 at a maximum bandwidth without tying up the bus 118. Therefore, once the processor 114 initiates a DMA transfer, the processor 114 may continue to perform other tasks and access the bus 118 without bus contention issues with the DMA control 124. Removing the burden of actively loading PLD programming data from the processor 114 enables the processor 114 to perform other system initialization tasks earlier in the system initialization process, thus the total system initialization time may be reduced, increasing system responsiveness after a reset. In an exemplary embodiment, the processor 114 accesses the bus 128 through optional bus 129. The optional bus 129 provides an alternate path between the processor 114 and the DMA control 124, enabling the processor 114 to access memory mapped elements attached to the bus 128. Other logic or memory (not depicted) with the IC 104 may also be coupled to the DMA bus 128, providing alternate sources or destinations for reads or writes through the DMA control 124 or the processor 114. In an exemplary embodiment, the DMA control 124 is configurable by the processor 114, allowing the processor 114 to control such features as a DMA source address, a DMA destination address, a transfer word count, and trigger events, such as a processor interrupt. The processor 114 may configure and read the status of the DMA control 124 through the bus 118. In an exemplary embodiment, the processor 114 halts the DMA control 124 when an error condition is detected.

The DMA control 124 interfaces with the I/O interface 126 through a bus 140. The bus 140 may include address, data, control, status, interrupt, and clock lines in a parallel or serial configuration. The I/O interface 126 provides signal conditioning and electrical buffering between the bus 140 and the network/bus 112. The I/O interface 126 may include application specific drivers and logic to support the network/bus 112, such as PCI, Ethernet, inter-integrated circuit ($I^2C$), universal serial bus (USB), IEEE-1394 (FireWire), control area network bus (CAN), proprietary network or bus formats, and other network or bus standards known in the art. In an exemplary embodiment, once the processor 114 configures and commands the DMA control 124 to start, the DMA control 124 acquires PLD programming data from the NVM 110 through the network/bus 112, the I/O interface 126, and the bus 140. The DMA control 124 then passes the acquired PLD programming data to the PLD I/F 116 through the DMA bus 128.

In an exemplary embodiment, the PLD I/F 116 includes a configuration and status register 130, a data buffer 132, and pacing logic 134. The PLD I/F 116 may further include bus selector 136, a memory map control 138, and a multiplexer 142. The configuration and status register 130 may appear as a single register in the memory map or register map of the processor 114 or may be distributed between multiple registers (1 to Y). In an exemplary embodiment, the configuration and status register 130 is mapped to one or more control and status lines of the PLD 106. The configuration and status register 130 may also provide access to the programming port 107 of the PLD 106. For example, a common address decode may be used to write commands to the PLD 106 and read the status of the PLD 106 through the configuration and status register 130. In an exemplary embodiment, the configuration and status register 130 includes individually addressable elements such that a command written to the PLD 106 can be read back separately from the PLD 106 status. Software executing upon the processor 114 may perform write and read operations to the configuration and status register 130 allowing manipulation of control lines of the PLD 106 to initiate a programming cycle, and to check for successful programming completion. Multiple configuration and status registers (1 to Y) 130 may exist within the PLD I/F 116 when the number of control and status lines of the PLD 106 is greater than the register width of the IC 104. Multiple configuration and status registers 130 may also be available to support individual programming of multiple PLDs 106.

The contents and function of the configuration and status register 130 are dependent upon the manufacturer and product family of the PLD 106. For example, if the PLD 106 is an Altera Stratix II device, an "nCONFIG" signal may be output to start a configuration (PLD programming) cycle. Using one or more configuration and status registers 130 to manipulate a complete power-on sequence for a PLD, such as the PLD 106, provides modularity to operate on a wide range of PLD devices without the need for new hardware or hardware modification. The configuration and status register 130 may also provide other configuration settings internal to the PLD I/F 116, such as configuring the timing of the pacing logic 134.

In an exemplary embodiment, the data buffer 132 is a temporary holding location for data received from the DMA control 124. The rate that data is written to the data buffer 132 may vary from the rate that data is read from the data buffer 132. The data buffer 132 may include RAM, a FIFO, and/or one or more registers. In an exemplary embodiment, the pacing logic 134 controls the rate and format of data transmitted to the PLD 106 through the I/O interface 120 and busses 122 and 108. The pacing logic 134 may be configured through software commands executed upon the processor 114 or written through the DMA control 124. In an alternate exemplary embodiment, the pacing logic 134 is configured in firmware. The pacing logic 134 may control the timing, byte order (e.g., big endian versus little endian), and data word width of data read from the data buffer 132 and written to I/O interface 120 for output to the PLD 106. In an exemplary embodiment, the pacing logic 134 controls the multiplexer 142 to select data from the data buffer 132.

Some PLD families support programming with compressed or encrypted data, requiring more than one clock cycle per byte, while other PLD families support programming one byte per clock cycle. The combination of the pacing logic 134 with the data buffer 132 can handle the programming requirements of a wide array of PLDs 106. In an exemplary embodiment, the data buffer 132 receives PLD programming data in bursts (e.g., 16 bytes) from the DMA control 124 at a DMA speed, and the pacing logic 134 reads and transmits the PLD programming data using programming timing supported by the PLD 106 (e.g., 1 byte per clock cycle) to the programming port 107 on the PLD 106 at a PLD programming speed. The IC 104 and the PLD 106 may operate on different clocks and/or at different speeds (e.g., a stepped down or stepped up clock speed). In an exemplary embodiment, the pacing logic 134 utilizes counters, phase-locked loops (PLLs), and/or other techniques known in the art to establish and adjust the timing sequence of the PLD programming data transmitted to the PLD 106. The pacing logic 134 maximizes available programming bandwidth without requiring intervention of the processor 114 to monitor and adjust the programming sequence. Byte ordering support in the PLD I/F 116 may further enable a variety of system configurations, including both big endian and little endian addressing/ordering schemes. Furthermore, as bus widths may vary between a PLD programming port and the DMA control 124, the PLD I/F 116 may support a variety of configurations (e.g., 32-bit DMA data to an 8-bit PLD programming port). In an exemplary embodiment, the memory map control 138 provides addressing support, byte ordering, and bus width translation. The memory map control 138 may also arbitrate access to the bus 128.

In an exemplary embodiment, elements of the PLD I/F 116, such as the configuration and status register 130, the data buffer 132, and the pacing logic 134 are accessible to the processor 114 and the DMA control 124. The bus selector 136 may enable either busses 118 or 128 to access the configuration and status register 130. Supporting multiple access paths may provide enhanced flexibility and configurability to optimize the performance of the system 100 and increase failure immunity through back-up or alternate paths. Using the bus selector 136 and busses 128 and 118, many options exist to support programming the PLD 106. For example, either the processor 114 or the DMA control 124 may set a value in the configuration and status register 130 to configure the PLD 106 in the programming mode. In an exemplary embodiment, the PLD programming port 107 of the PLD 106 is accessible through the data buffer 132 and the multiplexer 142, or through the configuration and status register 130. Thus, the processor 114 or the DMA control 124 may transmit PLD programming data to the PLD 106 through either the data buffer 132 and the multiplexer 142, or through the configuration and status register 130. While it may be preferable to provide multiple paths to program the PLD 106, in an exemplary embodiment, the bus selector 136 and optional bus 129 are removed to reduce the amount of resources used in the IC 104. The multiplexer 142 may also be removed from the IC 104 if the data buffer 132 is a single element or otherwise coupled to the bus 122. Although the bus selector 136 and the memory map control 138 are depicted within the PLD I/F 116, it will be understood that these elements may be external to the PLD I/F 116.

In an exemplary embodiment, data write access to the PLD programming port 107 of the PLD 106 is available when the PLD 106 is in the PLD programming (initialization) mode. While the PLD 106 is not in the PLD programming mode, access to the programming port on the PLD 106 may be blocked through the memory map control 138 (e.g., inaccessible or fenced off from the processor 114 and the DMA control 124 through the memory map), such that a programmed PLD 106 cannot be inadvertently corrupted, thus improving overall system reliability and availability. The PLD programming mode may be determined by reading the configuration and status register 130. The configuration and status register 130 may also indicate when an error condition occurs during PLD programming.

It will be understood by those skilled in the art that the IC 104 and the assembly 102 contain other elements known in the art that are not depicted in FIG. 1. For example, the assembly 102 may include other interfaces and circuitry, including one or more clocks, power supplies, voltage converters, noise suppression/filtering elements, decoupling capacitors, power and ground connections, heat sinks, and discrete components. The IC 104 may include other logic blocks and elements not depicted in FIG. 1, such as first-in-first-out (FIFO) buffers, random access memory (RAM) blocks, read-only memory (ROM), voltage rails, clocks, PLLs, registers, analog-to-digital (A/D) converters, digital-to-analog (DAC) converters, I/O pin drivers, and other such elements.

To summarize, the system 100 uses DMA to initialize a PLD 106. In an exemplary embodiment, the system 100 includes the PLD 106 including a programming port 107 with a control line, the PLD 106 on the assembly 102. The system 100 may further include the IC 104 operably coupled to the programming port 107 of the PLD 106, the IC 104 on the assembly 102. In an exemplary embodiment, the IC 104 includes an I/O interface 120 for converting a signal format between the IC 104 and the PLD 106. The IC 104 may further include a PLD interface 116, the PLD interface 116 including a configuration and status register 130, a data buffer 132, and pacing logic 134. In an exemplary embodiment, the configuration and status register 130 is adapted to manipulate the control line of the programming port 107 of the PLD 106 via the I/O interface 120. The data buffer 132 may temporarily hold PLD programming data received from a DMA control 124 at a DMA speed. The pacing logic 134 can control the speed of transmitting the PLD programming data to the programming port 107 on the PLD 106 via the I/O interface 120 at a PLD programming speed.

Figure 2:
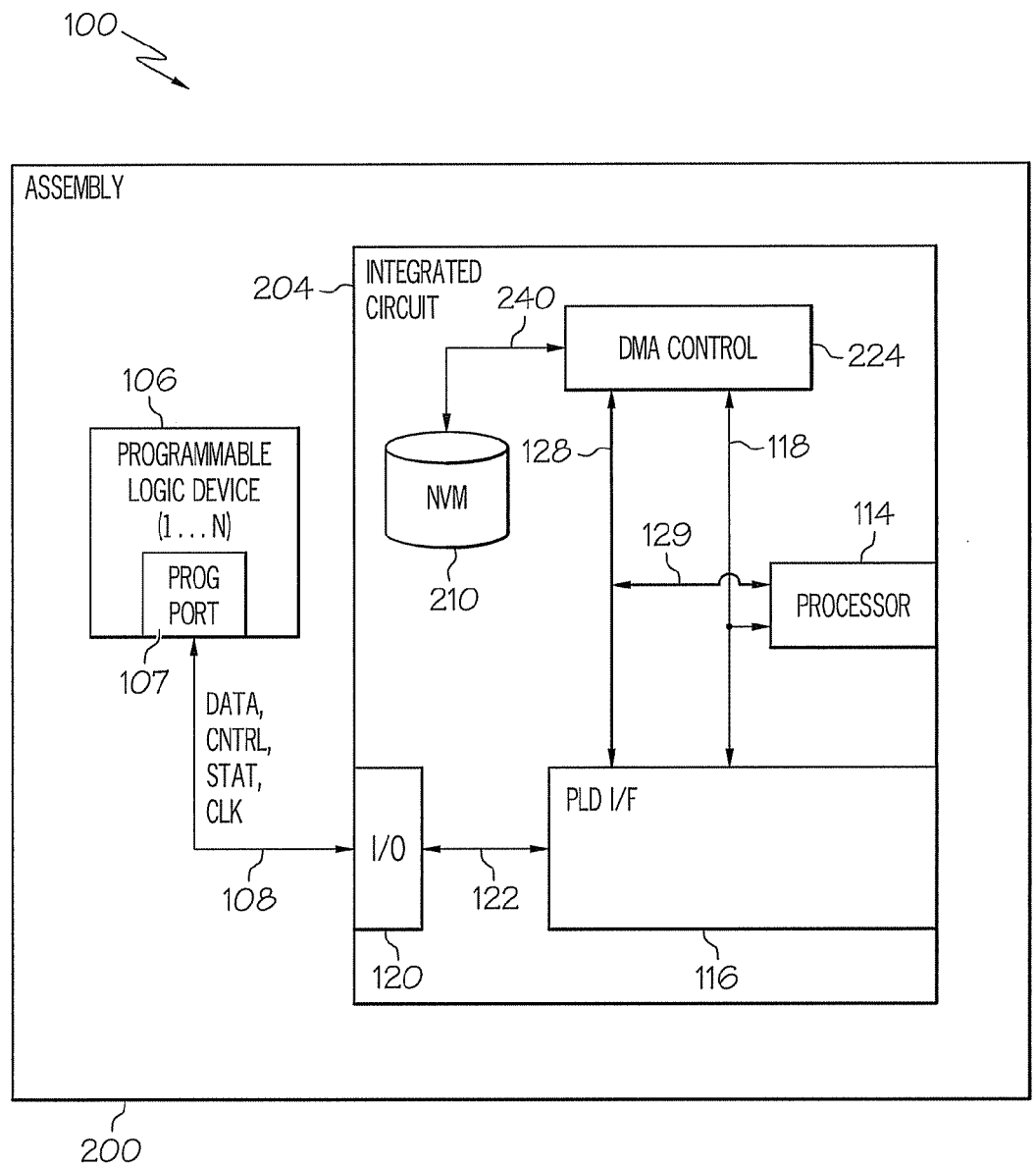
FIG. 2 is a block diagram of an assembly using DMA to initialize a PLD that may be implemented by an exemplary embodiment.

Turning now to FIG. 2, an assembly 200 upon which using DMA to initialize a PLD can be implemented will now be described in accordance with an exemplary embodiment. The assembly 200 may be a card, a board, a module, or a subsystem within a larger system. Similar to the assembly 102 of FIG. 1, the assembly 200 in FIG. 2 includes an integrated circuit (IC) 204 operably coupled to a programming port 107 of a PLD 106 through a bus 108, enabling the IC 204 perform such operations as configuring the PLD 106 in a programming mode, programming the PLD 106, and monitoring the status of the PLD 106. While only one PLD 106 is depicted, it will be understood that multiple PLDs (between 1 and N) may be coupled to the IC 204. In an exemplary embodiment, the IC 204 is a system-on-a-chip (SOC), including a processor 114, a PLD interface (I/F) 116, an input/output (I/O) interface 120, a DMA control 224, and NVM 210. The IC 204 may be any integrated circuit technology known in the art, such as an ASIC or a PLD. The like numbered elements of the assembly 200 in FIG. 2 provide substantially similar features and advantages as previously described in reference to the assembly 102 of FIG. 1. As some IC technologies may include internal non-volatile memory, such as the NVM 210, the IC 204 depicted FIG. 2 leverages the storage capability of such an IC, thus eliminating the need for a remote storage element, such as the NVM 110 of FIG. 1.

As depicted in FIG. 2, the DMA control 224 directly accesses PLD programming data stored within the NVM 210 through a bus 240. The bus 240 may include address, data, control, interrupt, and clock lines in a parallel or serial configuration. The DMA control 224 operates in a similar manner as the DMA control 124 of FIG. 1, except that the DMA control 224 of FIG. 2 can directly access the PLD programming data. In an exemplary embodiment, by removing the connection to an external network/bus 112, the DMA control 224 of FIG. 2 provides faster access to PLD programming data as compared to the DMA control 124 depicted in FIG. 1. The assembly 200 may be preferred for a PLD 106 supporting faster programming speeds and smaller PLD programming files, as the size of the NVM 210 may be constrained as an internal element of the IC 204.

Figure 3:
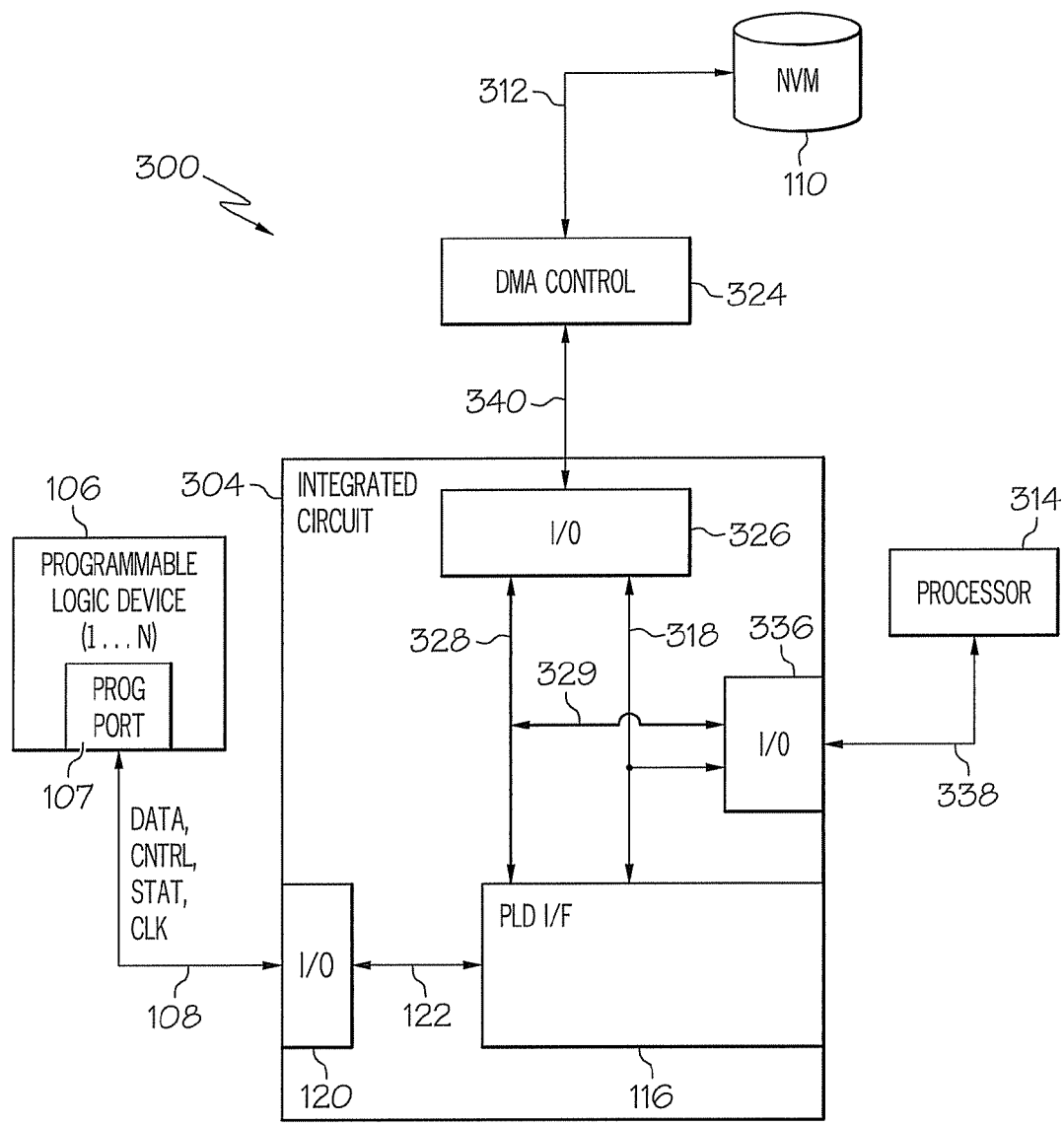
FIG. 3 is a block diagram of a system using DMA to initialize a PLD that may be implemented by an exemplary embodiment.

Turning now to FIG. 3, a system 300 upon which using DMA to initialize a PLD can be implemented will now be described in accordance with an exemplary embodiment. Similar to the system 100 of FIG. 1, the system 300 includes an integrated circuit (IC) 304 operably coupled to a programming port 107 of a PLD 106 through a bus 108, enabling the IC 304 perform such operations as configuring the PLD 106 in a programming mode, programming the PLD 106, and monitoring the status of the PLD 106. While only one PLD 106 is depicted, it will be understood that multiple PLDs (between 1 and N) may be coupled to the IC 304. The IC 304 may be any integrated circuit technology known in the art, such as an ASIC or a PLD. In an exemplary embodiment, the IC 304 of FIG. 3 includes reduced elements and functionality as compared to the IC 104 of FIG. 1. The like numbered elements of the system 300 provide substantially similar features and advantages as previously described in reference to the system 100 of FIG. 1. In an exemplary embodiment, the IC 304 includes a PLD interface 116 operably coupled to I/O interfaces 120, 326, and 336. The system 300 further includes a processor 314 operably coupled to the I/O interface 336 through a bus 338. The system 300 also includes a DMA control 324 operably coupled to the I/O interface 326 through a bus 340. In an exemplary embodiment, the DMA control 324 is operably coupled to an NVM 110 through a bus 312. Busses 312, 338, and 340 utilize any bus format known in the art and as previously described in reference to other such busses in FIG. 1. The busses 312, 338, and 340 may include address, data, control, status, interrupt, and clock lines in a parallel or serial configuration. In an exemplary embodiment, the bus 340 supports both DMA data and non-DMA data through bus arbitration. In an alternate exemplary embodiment, the bus 340 includes independent paths for DMA and non-DMA data. Similarly, the bus 338 may include parallel structures for memory mapped and register mapped accesses to the IC 304, or alternatively, a bus arbitration scheme may be employed on the bus 338.

The processor 314 may be any processing circuit capable of executing instructions known in the art, such as a microprocessor, a microcontroller, a state-machine, a digital signal processor (DSP), and/or a logic device. The processor 314 may include a readable storage medium for storing executable instructions. In an exemplary embodiment, the processor 314 is located upon the same assembly or subsystem as the IC 304. In an alternate exemplary embodiment, the processor 314 is located upon a remote assembly or subsystem relative to the IC 304. Similarly, the DMA control 324 may be located upon the same assembly or subsystem as the IC 304, or the DMA control 324 may be located remotely relative to the IC 304. In an exemplary embodiment, the NVM 110 is located remotely relative to the IC 304 (e.g., on a separate assembly or subsystem).

In an exemplary embodiment, a bus 318 within the IC 304 provides a path for non-DMA data between the PLD I/F 116, the I/O interface 326, and the I/O interface 336. The bus 318 may include address, data, control, status, interrupt, and clock lines in a parallel or serial configuration. The bus 318 provides read/write access for the processor 314 through the I/O interface 336 to the PLD I/F 116 and to the DMA control 324 though the I/O interface 326 and the bus 340. The DMA control 324 and the PLD I/F 116 may appear directly within the register map and/or memory map of the processor 314. In an exemplary embodiment, a bus 328 within the IC 304 provides a path for memory mapped accesses between the PLD I/F 116 and the I/O interface 326. The bus 328 may include address, data, control, status, interrupt, and clock lines in a parallel or serial configuration. In an exemplary embodiment, the processor 314 accesses the bus 328 through optional bus 329. The optional bus 329 provides an alternate path between the processor 314 and the DMA control 324, enabling the processor 314 to access memory mapped elements attached to the bus 328. In an exemplary embodiment, the bus 328 is primarily used for passing data, while the bus 318 is primarily used for configuration and status. In an exemplary embodiment, the I/O interfaces 326 and 336 perform similar functions of bus-to-bus conversion as previously described in reference to the I/O interface 120 in FIG. 1. The I/O interface 326 may perform bus arbitration between the internal busses 318 and 328 and the bus 340. Similarly, the I/O interface 336 may perform bus arbitration between the internal busses 318 and 329 and the bus 338.

The IC 304 depicted in FIG. 3 may be preferred when a low-cost IC implementation of using DMA to initialize a PLD is desired in a system with an existing processor and DMA control, such as the processor 314 and the DMA control 324. The IC 304 depicted in FIG. 3 may be lower in cost due to reduced device complexity as compared to the IC 104 of FIG. 1 and the IC 204 of FIG. 2.

Figure 4:
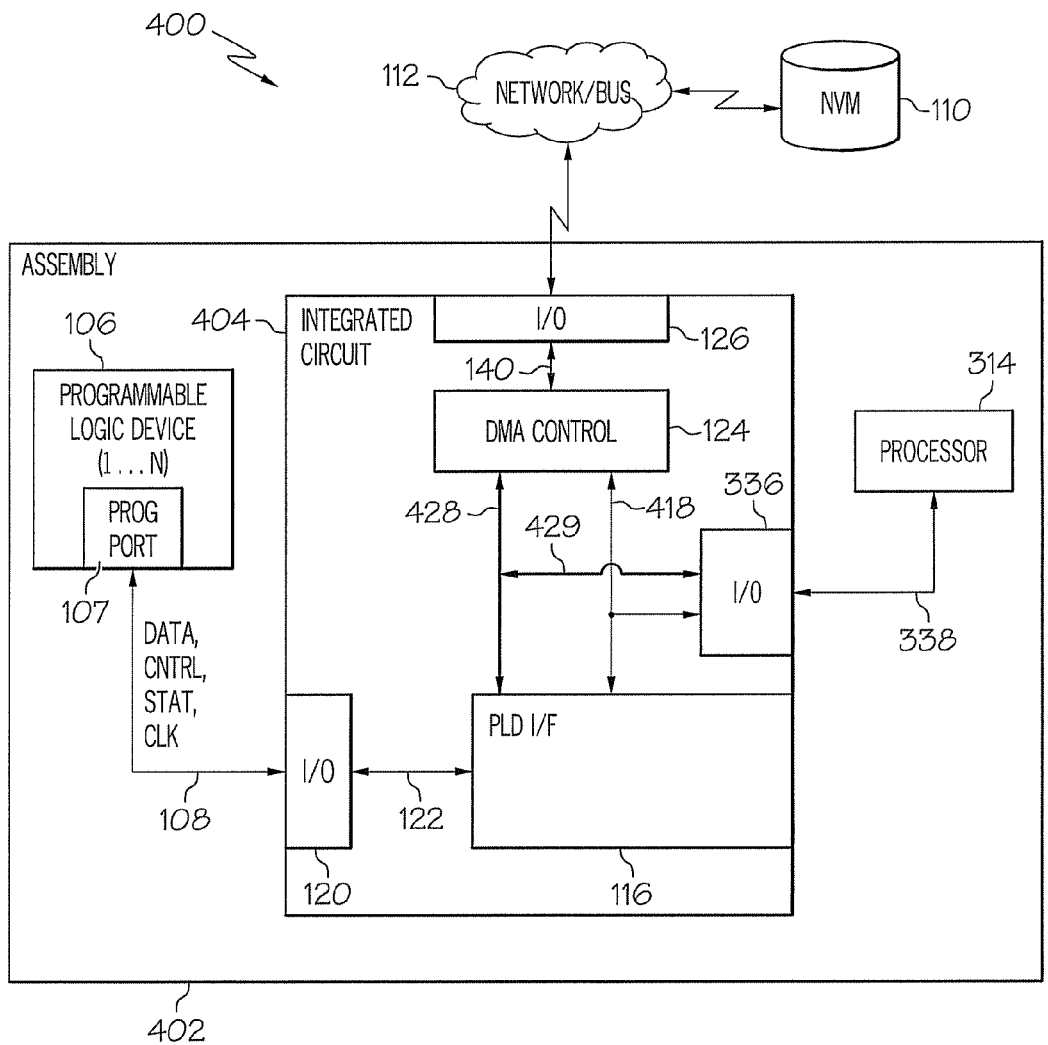
FIG. 4 is a block diagram of a system using DMA to initialize a PLD that may be implemented by an exemplary embodiment.

Turning now to FIG. 4, a system 400 upon which using DMA to initialize a PLD can be implemented will now be described in accordance with an exemplary embodiment. Similar to the system 100 of FIG. 1, the system 400 includes an assembly 402 that further includes an integrated circuit (IC) 404 operably coupled to a programming port 107 of a PLD 106 through a bus 108, enabling the IC 404 perform such operations as configuring the PLD 106 in a programming mode, programming the PLD 106, and monitoring the status of the PLD 106. The assembly 402 may be a card, a board, a module, or a subsystem within a larger system. While only one PLD 106 is depicted, it will be understood that multiple PLDs (between 1 and N) may be coupled to the IC 404. The IC 404 may be any integrated circuit technology known in the art, such as an ASIC or a PLD. The assembly 402 further includes a processor 314 operably coupled to the IC 404 through an I/O interface 336 and a bus 338, similar to the system 300 of FIG. 3. The like numbered elements of the system 400 provide substantially similar features and advantages as previously described in reference to the systems 100-300 of FIGS. 1-3. In an exemplary embodiment, the IC 404 includes a PLD interface 116 operably coupled to the I/O interface 336 and a DMA control 124 through a bus 418. Similar to the IC 104 of FIG. 1, the IC 404 includes an I/O interface 120 operably coupled to the PLD I/F 116 through a bus 122; an I/O interface 126 operably coupled to the DMA control 124 through a bus 140; a bus 428 operably coupling the PLD I/F 116 to the DMA control 124; and an optional bus 429 operably coupling the I/O interface 336 to the bus 428 such that the processor 314 can access the bus 428. The system 400 further includes an NVM 110 external to the assembly 402, the NVM 110 operably coupled through a network/bus 112 to the I/O interface 126 of the IC 404.

The bus 418 of the IC 404 provides a path for register accesses between the PLD I/F 116, the DMA control 124, and the I/O interface 336. The bus 418 may include address, data, control, status, interrupt, and clock lines in a parallel or serial configuration. The bus 418 provides read/write access for the processor 314 through the I/O interface 336 to the PLD I/F 116 and to the DMA control 124. The DMA control 124 and the PLD I/F 116 may appear directly within the memory and/or register map of the processor 314. In an exemplary embodiment, the bus 428 of FIG. 4 provides substantially similar features and advantages as the bus 128 of FIG. 1. In an exemplary embodiment, the bus 428 is primarily used for passing data, while the bus 418 is primarily used for configuration and status.

The system 400 may be preferred when an IC, such the IC 404 depicted in FIG. 4, does not include an embedded processor, and a processor is interfaced to the IC on a common assembly, such as the processor 314 of the assembly 402. In an exemplary embodiment, the processor 314 supports multiple ICs 404 on the assembly 402.

Figure 5:
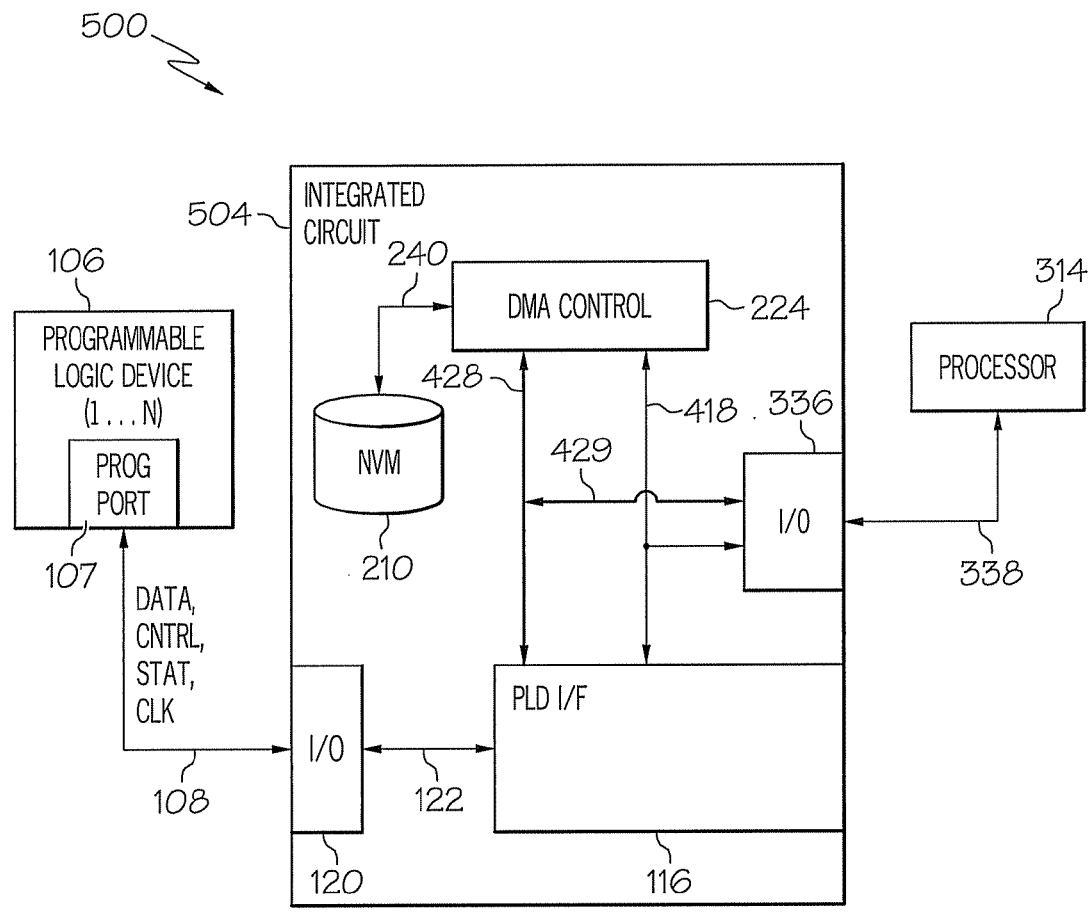
FIG. 5 is a block diagram of a system using DMA to initialize a PLD that may be implemented by an exemplary embodiment.

Turning now to FIG. 5, a system 500 upon which using DMA to initialize a PLD can be implemented will now be described in accordance with an exemplary embodiment. Similar to the system 300 of FIG. 3, the system 500 includes an integrated circuit (IC) 504 operably coupled to a programming port 107 of a PLD 106 through a bus 108, enabling the IC 504 perform such operations as configuring the PLD 106 in a programming mode, programming the PLD 106, and monitoring the status of the PLD 106. The system 500 further includes a processor 314 operably coupled to the IC 504 through an I/O interface 336 and a bus 338, enabling the processor 314 to perform such tasks as reading and writing data to the IC 504. While only one PLD 106 is depicted, it will be understood that multiple PLDs (between 1 and N) may be coupled to the IC 504. The IC 504 may be any integrated circuit technology known in the art, such as an ASIC or a PLD. The IC 504 is similar to the IC 204 of FIG. 2, with the exception that the processor 114 of IC 204 has been moved external to the IC 504 as the processor 314. The like numbered elements of the system 500 provide substantially similar features and advantages as previously described in reference to the systems 100, 300, and 400, as well as the assembly 200 of FIGS. 1-4. The system 500 may be preferred when an IC, such as the IC 504 depicted in FIG. 5, contains NVM but does not contain a processor, such as the NVM 210 and the processor 314.

Figure 6:
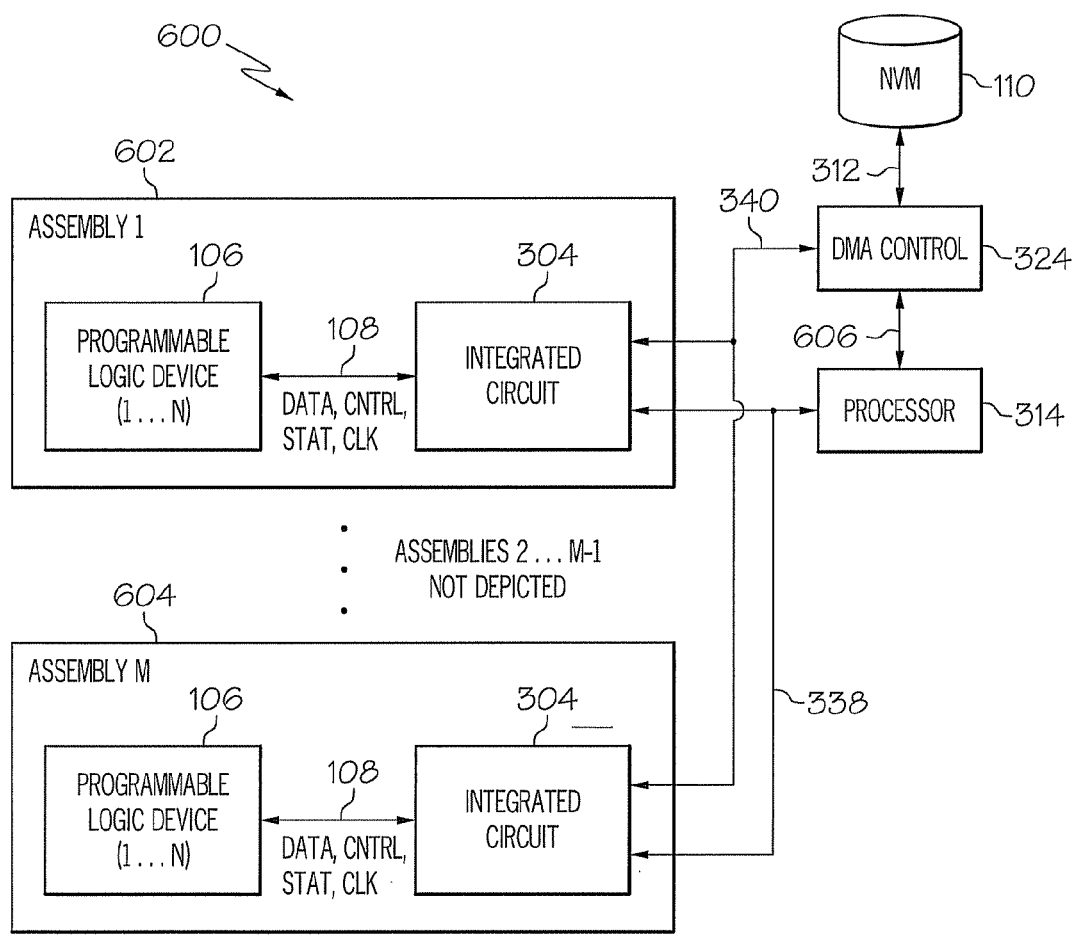
FIG. 6 is a block diagram of a system with multiple assemblies using DMA to initialize a PLD that may be implemented by an exemplary embodiment.

Turning now to FIG. 6, a system 600 upon which using DMA to initialize a PLD can be implemented will now be described in accordance with an exemplary embodiment. In an exemplary embodiment, the system 600 includes multiple assemblies (1 to M) operably coupled to a DMA control 324 through a bus 340 and to a processor 314 through a bus 338. The multiple assemblies (1 to M) may be cards, boards, modules, subsystems, or any combination thereof. Two exemplary assemblies 602 and 604 (assemblies 1 and M) are depicted in FIG. 6, with a variable number of intermediate assemblies (assemblies 2 to M-1) not depicted. In an exemplary embodiment, each assembly 602-604 includes an integrated circuit (IC) 304 operably coupled to a PLD 106 through a bus 108, as previously described in reference to the system 300 of FIG. 3. Each assembly 602-604 may include a different number of PLDs 106 (1 to N).

The DMA control 324 is operably coupled to NVM 110 through a bus 312 and to the processor 314 through a bus 606. The like numbered elements of the system 600 provide substantially similar features and advantages as previously described in reference to the system 300 of FIG. 3. The bus 606 may include address, data, control, status, interrupt, and clock lines in a parallel or serial configuration. In an exemplary embodiment, the DMA control 324 and the processor 314 are located in a common device, such as a microcontroller, a DSP, or a PLD. The system 600 depicted in FIG. 6 may be preferred when multiple PLDs 106 are distributed across multiple assemblies, and each assembly does not include an independent processor, such as the assemblies 602-604 and the processor 314.

Figure 7:
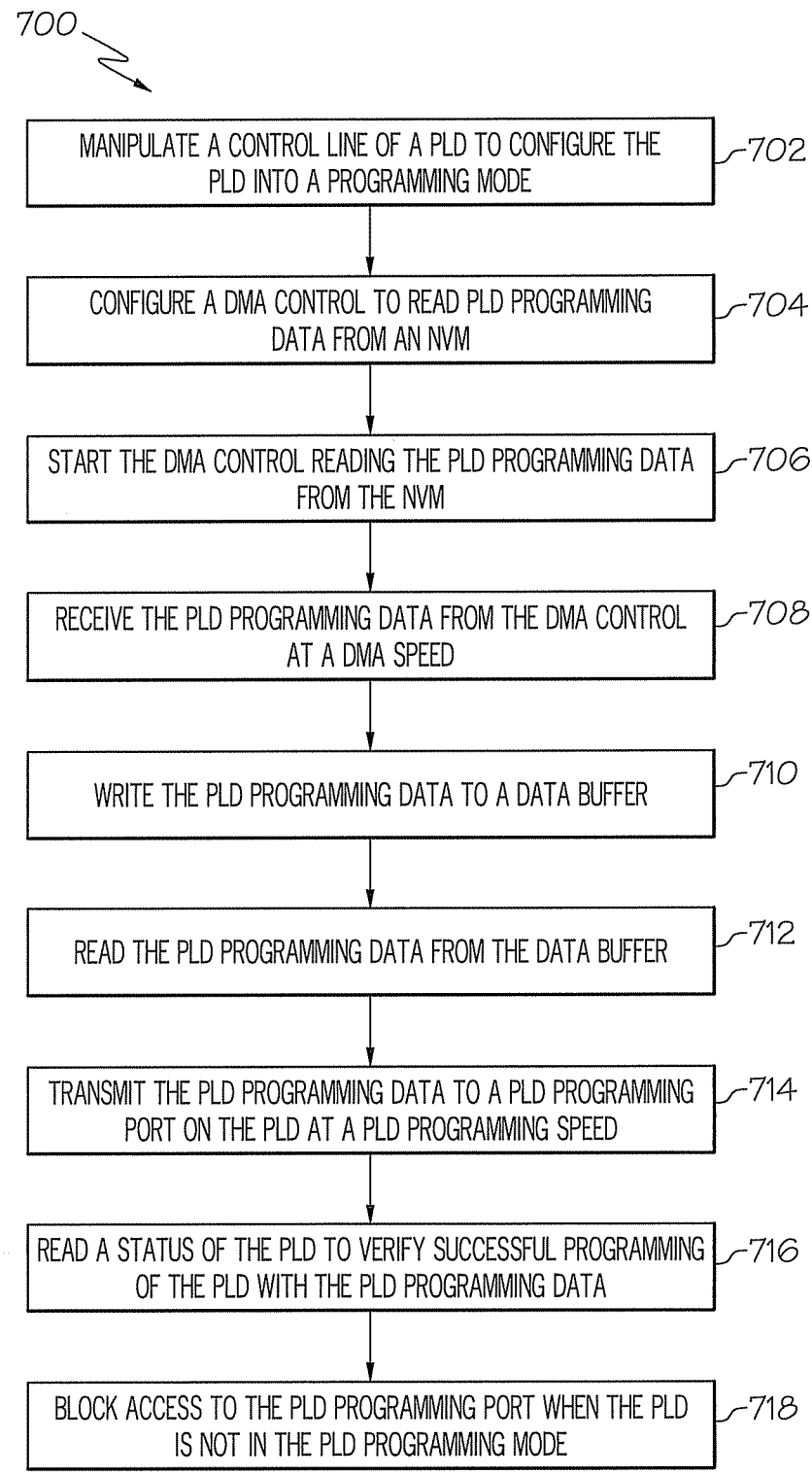
FIG. 7 is a flow diagram describing a process for using DMA to initialize a PLD in an exemplary embodiment.

Turning now to FIG. 7, a process 700 for using DMA to initialize a PLD will now be described in accordance with an exemplary embodiment. In an exemplary embodiment, the process 700 increases processor throughput and reduces the board area through using a DMA control to initialize a PLD. While the process 700 may apply to the systems and assemblies 100-600 of FIGS. 1-6, the process is described in reference to the system 100 of FIG. 1 for ease of explanation. At block 702, a control line of the PLD 106 is manipulated to configure the PLD 106 in a programming mode. In an exemplary embodiment, the processor 114 initiates manipulating the PLD control line of the bus 108 by writing a command to the configuration and status register 130 of the PLD I/F 116 through the bus 118. The processor 114 may also configure the PLD I/F 116 for compatibility with the PLD 106, including features such as timing, byte order, and data word width. In an alternate exemplary embodiment, the DMA control 124 initiates manipulating the PLD control line of the bus 108 by writing a command to the configuration and status register 130 of the PLD I/F 116 through bus 128 and bus selector 136.

At block 704, the DMA control 124 is configured to read the PLD programming data from the NVM 110. In an exemplary embodiment, the processor 114 commands the configuration of the DMA control 124 through the bus 118. The processor 114 may select a source address, a destination address, a word count, and configure other settings within the DMA control 124.

At block 706, the processor 114 starts the DMA control 124 reading the PLD programming data from the NVM. In an exemplary embodiment, the DMA control 124 masters or places a request over the network/bus 112 for PLD programming data stored in the NVM 110 based upon the DMA control 124 configuration programmed by the processor 114. PLD programming data received from the NVM 110 at the DMA control 124 is passed to the PLD I/F 116 through the bus 128.

At block 708, the PLD programming data is received from the DMA control at a DMA speed. In an exemplary embodiment, various DMA data bus widths, formats, and speeds are supported by the PLD I/F 116. At block 710, the PLD programming data is written to the data buffer 132. Writing to the data buffer 132 may be controlled by the DMA control 124 or the memory map control 138. In an exemplary embodiment, the data buffer 132 is a FIFO, a RAM, or a register-based buffer. The size of the data buffer 132 may be large enough to hold the entire PLD programming data file or large enough to hold blocks a data sized relative to the speed difference between the DMA speed and the PLD programming speed. In an alternate exemplary embodiment, the PLD programming data is written to the configuration and status register 130. The configuration and status register 130 may provide an alternative path to transmit the PLD programming data to a programming port 107 on the PLD 106 at a PLD programming speed. The PLD programming data can be written to the data buffer 132 or the configuration and status register 130 by the DMA control 124 or the processor 114.

At block 712, the PLD programming data is read from the data buffer 132. In an exemplary embodiment, the byte order of the data read from the data buffer 132 can be altered to support either big endian or little endian formats. The memory map control 138 may control the byte ordering and addressing of values in the data buffer 132. The process of reading data from the data buffer 132 may adjust internal pointers in the data buffer 132 to maintain the sequence of the PLD programming data within the data buffer 132. In an exemplary embodiment, the data word width of the PLD programming data written to the data buffer 132 is modified when the PLD programming data is read from the data buffer 132. Data word width modification may enable a variety of DMA controls 124 and PLD programming ports 107 to be supported with different bus widths (e.g., 8-bit, 16-bit, 24-bit, 32-bit, 64-bit, etc.). In an exemplary embodiment, the pacing logic 134 switches inputs to the multiplexer 142 to access different locations within the data buffer 132. The pacing logic 134 may select data buffer locations for reading at a PLD programming speed. In an exemplary embodiment, the DMA speed is different than the PLD programming speed. In an alternate exemplary embodiment, the DMA speed is the same as the PLD programming speed. When the DMA speed is the same or slower than the PLD programming speed, PLD programming data may pass through the data buffer 132 without accumulating or pass through the configuration and status register 130.

At block 714, the PLD programming data is transmitted to the programming port 107 on the PLD 106 at the PLD programming speed. In an exemplary embodiment, the programming port 107 of the PLD 106 is interfaced to the IC 104 through bus 108. In an exemplary embodiment, the transmission speed is managed by the pacing logic 134.

At block 716, the status of the PLD 106 is read to verify successful programming of the PLD 106 with the PLD programming data. The status of the PLD 106 may be read by the processor 114 though the configuration and status register 130. In an exemplary embodiment, the status of the PLD 106 is read periodically to check for errors or PLD programming completion. In an alternative exemplary embodiment, the processor 114 is notified of an error or PLD programming completion though one or more interrupt signals.

At block 718, access to the programming port 107 on the PLD 106 is blocked when the PLD 106 is not in the programming mode. Access may be denied to either or both the processor 114 and the DMA control 124 when the PLD 106 is not in the programming mode. Access to the programming port 107 on the PLD 106 may be blocked by the memory map control 138. The memory map control 138 may determine the PLD programming mode status through the configuration and status register 130. In an exemplary embodiment, the memory map control 138 accesses the configuration and status register 130 through the pacing logic 134. In an alternate exemplary embodiment, the memory map control 138 accesses the configuration and status register 130 through the bus selector 136.

In an exemplary embodiment, blocks 708-714 are performed concurrently in a pipelined or streamed fashion, while blocks 702-706 and 716-718 are performed sequentially. Using a pipelined or streamed approach may further maximize available bandwidth to reduce the total time required to program the PLD 106 with the PLD programming. At any point during the process 700, the processor 114 may pause or terminate the PLD programming sequence for various reasons, such as an error, a higher priority request for system resources, or a user request. On an error condition, the processor 114 may attempt to repeat the process 700. Alternatively, the processor 114 may send a message, assert a signal, or otherwise notify external resources of the error condition so that corrective actions can be taken.

Technical effects and benefits of exemplary embodiments include using a DMA control to initialize a PLD. The DMA control streams PLD programming data from an NVM to PLD I/F, freeing up a system processor to perform other tasks while a PLD is programmed. Exemplary embodiments enable the NVM to be located external of an assembly or subsystem upon which the PLD is located. Moving the NVM to a remote location may reduce assembly or subsystem cost, weight, power consumption, board area, heat, and provide other advantages and benefits. By using available or embedded system resources, there is no board area penalty or added cost typically associated with the use of a serial EEPROM device to program the PLD. Through using a DMA control and associated logic, PLD programming data may be rapidly loaded via a parallel programming path. Exemplary embodiments further provide flexibility in adapting timing, byte order, and data word width between the DMA control and the PLD. The availability of PLD control and status information to the processor initiating the PLD programming process may enable the processor to monitor for a successful transfer, error conditions, and start or stop a PLD programming sequence. Furthermore, the control and status register in the PLD I/F may provide an alternative path to load the PLD with PLD programming data should the DMA control fail.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. An integrated circuit (IC) for using direct memory access (DMA) to initialize a programmable logic device (PLD), the IC operably coupled to the PLD, the PLD configurable to perform application specific functions, the IC comprising:
an input/output (I/O) interface, the I/O interface converting a signal format between the IC and the PLD; and
a PLD interface, the PLD interface including:
a configuration and status register, the configuration and status register adapted to manipulate a control line of the PLD to configure the PLD in a programming mode via the I/O interface;
a data buffer, the data buffer for temporarily holding PLD programming data received from a DMA control at a DMA speed, the PLD programming data configured to program the PLD to perform the application specific functions; and
pacing logic, the pacing logic controlling a speed of transmitting the PLD programming data to a programming port on the PLD via the I/O interface at a PLD programming speed, the PLD programming speed being a different speed than the DMA speed, and in combination with the PLD configured in the programming mode based on manipulation of the control line, programming the PLD to perform the application specific functions.

2. The IC of claim 1 further comprising:
a DMA control, the DMA control operably coupled to the PLD interface.

3. The IC of claim 2, wherein the DMA control is operably coupled to a non-volatile memory device (NVM), the NVM storing the PLD programming data.

4. The IC of claim 3 further comprising the NVM.

5. The IC of claim 3 further comprising:
a processor, the processor operably coupled to the PLD interface and the DMA control, and wherein the processor performs a method, the method comprising:
writing a value to the configuration and status register of the PLD interface, the value utilized for manipulating the control line of the PLD via the I/O interface to configure the PLD in a programming mode;
configuring the DMA control to read the PLD programming data from the NVM;
initiating the DMA control to start reading the PLD programming data from the NVM; and
reading the configuration and status register of the PLD interface to verify successful programming of the PLD with the PLD programming data.

6. The IC of claim 1, wherein the PLD interface modifies at least one of a data word width and a byte ordering of the PLD programming data written to the data buffer when the PLD programming data is read from the data buffer.

7. The IC of claim 1, wherein access to the programming port on the PLD is blocked when the PLD is not in the programming mode.

8. The IC of claim 1, wherein the PLD interface further includes a bus selector, the bus selector adapted to provide access to the configuration and status register for a processor and the DMA control; and
wherein the configuration and status register is adapted to transmit the PLD programming data to a programming port on the PLD via the I/O interface.

9. A system for using direct memory access (DMA) to initialize a programmable logic device (PLD), the PLD configurable to perform application specific functions, the system comprising:
the PLD including a programming port with a control line, the PLD on an assembly; and
an integrated circuit (IC) operably coupled to the programming port of the PLD, the IC on the assembly, and including:
an input/output (I/O) interface, the I/O interface converting a signal format between the IC and the PLD; and
a PLD interface, the PLD interface including:
a configuration and status register, the configuration and status register adapted to manipulate the control line of the programming port of the PLD via the I/O interface;
a data buffer, the data buffer for temporarily holding PLD programming data received from a DMA control at a DMA speed, the PLD program data configured to program the PLD to perform the application specific functions; and
pacing logic, the pacing logic controlling a speed of transmitting the PLD programming data to the programming port on the PLD via the I/O interface at a PLD programming speed, the PLD programming speed being a different speed than the DMA speed, and in combination with the PLD configured in the programming mode based on manipulation of the control line, programming the PLD to perform the application specific functions.

10. The system of claim 9 further comprising:
a DMA control, the DMA control operably coupled to the PLD interface.

11. The system of claim 10, wherein the DMA control is operably coupled to a non-volatile memory device (NVM), the NVM storing the PLD programming data.

12. The system of claim 11, wherein the NVM is located external to the assembly.

13. The system of claim 11 further comprising:
a processor, the processor operably coupled to the PLD interface and the DMA control, and wherein the processor performs a method, the method comprising:
writing a value to the configuration and status register of the PLD interface, the value utilized for manipulating the control line of the PLD via the I/O interface to configure the PLD in a programming mode;
configuring the DMA control to read the PLD programming data from the NVM;
initiating the DMA control to start reading the PLD programming data from the NVM; and reading the configuration and status register of the PLD interface to verify successful programming of the PLD with the PLD programming data.

14. The system of claim 9, wherein the PLD interface modifies at least one of a data word width and a byte ordering of the PLD programming data written to the data buffer when the PLD programming data is read from the data buffer; and wherein access to the programming port on the PLD is blocked when the PLD is not in a programming mode.

* * * * *